US010717837B2

(12) United States Patent
Tomizawa et al.

(10) Patent No.: US 10,717,837 B2
(45) Date of Patent: Jul. 21, 2020

(54) RESIN COMPOSITION AND PREPREG, RESIN SHEET, LAMINATE, AND PRINTED CIRCUIT BOARD COMPRISING SAME

(71) Applicant: MITSUBISHI GAS CHEMICAL COMPANY, INC., Tokyo (JP)

(72) Inventors: Katsuya Tomizawa, Tokyo (JP); Eisuke Shiga, Tokyo (JP); Meguru Ito, Tokyo (JP); Tomo Chiba, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 377 days.

(21) Appl. No.: 15/738,834

(22) PCT Filed: Jul. 4, 2016

(86) PCT No.: PCT/JP2016/069750
§ 371 (c)(1),
(2) Date: Dec. 21, 2017

(87) PCT Pub. No.: WO2017/006895
PCT Pub. Date: Jan. 12, 2017

(65) Prior Publication Data
US 2018/0179354 A1 Jun. 28, 2018

(30) Foreign Application Priority Data
Jul. 6, 2015 (JP) ................................. 2015-135274

(51) Int. Cl.
C08J 5/24 (2006.01)
C08K 3/00 (2018.01)
C08L 79/04 (2006.01)
C08L 57/00 (2006.01)
C08L 35/00 (2006.01)
C08K 5/3465 (2006.01)
H05K 1/03 (2006.01)
B32B 5/02 (2006.01)
B32B 15/14 (2006.01)
C08K 5/3447 (2006.01)
C08L 65/02 (2006.01)
H01L 23/14 (2006.01)
H01L 23/00 (2006.01)

(52) U.S. Cl.
CPC ............... C08J 5/24 (2013.01); B32B 5/02 (2013.01); B32B 15/14 (2013.01); C08K 3/00 (2013.01); C08K 5/3447 (2013.01); C08K 5/3465 (2013.01); C08L 35/00 (2013.01); C08L 57/00 (2013.01); C08L 65/02 (2013.01); C08L 79/04 (2013.01); H01L 23/145 (2013.01); H01L 23/562 (2013.01); H05K 1/03 (2013.01); B32B 2250/02 (2013.01); B32B 2250/03 (2013.01); B32B 2250/40 (2013.01); B32B 2260/046 (2013.01); B32B 2262/101 (2013.01); B32B 2311/12 (2013.01); B32B 2311/24 (2013.01); B32B 2457/08 (2013.01); C08J 2365/02 (2013.01)

(58) Field of Classification Search
CPC .......... C08J 5/24; C08J 2365/02; B32B 5/02; B32B 15/14; B32B 2250/03; B32B 2250/02; B32B 2250/40; B32B 2260/046; B32B 2262/101; B32B 2311/12; B32B 2311/24; B32B 2457/08; C08K 3/00; C08K 5/3447; C08K 5/3465; C08L 35/00; C08L 57/00; C08L 65/02; C08L 79/04; H01L 23/145; H01L 23/562; H05K 1/03
USPC ......................................................... 428/458
See application file for complete search history.

(56) References Cited

U.S. PATENT DOCUMENTS

| 4,777,236 | A | 10/1988 | Kramer |
| 2007/0270568 | A1 | 11/2007 | Ushiki et al. |
| 2009/0041942 | A1* | 2/2009 | Hayashi ................. B05D 5/068 |
| | | | 427/385.5 |
| 2011/0120753 | A1 | 5/2011 | Ushiki et al. |
| 2014/0227924 | A1 | 8/2014 | Nobukuni et al. |
| 2016/0125971 | A1 | 5/2016 | Hasebe et al. |
| 2016/0237246 | A1 | 8/2016 | Arii et al. |
| 2016/0309582 | A1 | 10/2016 | Tomizawa et al. |

FOREIGN PATENT DOCUMENTS

| JP | H09-221616 A | 8/1997 |
| JP | 2014-132066 A | 2/2002 |
| JP | 2008-242273 A | 10/2008 |
| JP | 2009-114377 A | 5/2009 |
| JP | 2010-229220 A | 10/2010 |
| JP | 2011-102384 A | 5/2011 |
| JP | 2012-172070 A | 9/2012 |
| JP | 2012197336 A | 10/2012 |
| JP | 201-127022 A | 6/2013 |
| JP | 2014-005464 A | 1/2014 |
| JP | 2014012751 A | 1/2014 |
| JP | 2002-060674 A | 7/2014 |
| TW | 201410777 A | 3/2014 |
| TW | 201504039 A | 2/2015 |
| WO | 2006/075654 A1 | 7/2006 |
| WO | 2012/165240 A1 | 12/2012 |
| WO | 2015/060266 A1 | 4/2015 |
| WO | 2015/105109 A1 | 7/2015 |

OTHER PUBLICATIONS

International Search Report from Application No. PCT/JP2016/069750, dated Sep. 27, 2016.
International Preliminary Report on Patentability from Application No. PCT/JP2016/069750, dated Jan. 9, 2018.

* cited by examiner

Primary Examiner — William K Cheung
(74) Attorney, Agent, or Firm — Greenblum & Bernstein, P.L.C.

(57) ABSTRACT

The present invention provides a resin composition containing an alkenyl-substituted nadimide and a perinone-based colorant, wherein the content of the perinone-based colorant is 0.8 parts by mass or less based on 100 parts by mass in total of resin-constituting components in the resin composition.

15 Claims, No Drawings

RESIN COMPOSITION AND PREPREG, RESIN SHEET, LAMINATE, AND PRINTED CIRCUIT BOARD COMPRISING SAME

This application is a U.S. National Stage Application under 35 U.S.C. § 371 of PCT International Application No. PCT/JP2016/069750, filed Jul. 4, 2016, which claims the benefit of Japanese Patent Application No. 2015-135274 filed on Jul. 6, 2015 with the Japan Patent Office, the entire disclosure of which is incorporated herein by reference.

TECHNICAL FIELD

The present invention relates to a resin composition and a prepreg, a resin sheet, a laminate, and a printed circuit board comprising the same.

BACKGROUND ART

Semiconductor packages widely used in electronics (e.g., personal computers), communication devices, etc. have been more highly functionalized or miniaturized in recent years. Along with this, the high integration or high-density packaging of each component for semiconductor packages has been increasingly accelerated. In, for example, printed wiring boards (PWBs) or printed circuit boards (PCBs) packed with electronic components, colored substrates are used from the viewpoint of the visual recognition of wiring, the aesthetic installation in products, etc., and prepregs or the like impregnated with a colored curable resin composition containing a colorant are routinely used as materials.

As for techniques related to the colored curable resin composition, for example, Patent Literature 1 discloses a colored curable resin composition containing (a) a color material, (b) a solvent, (c) at least one member selected from the group consisting of a polymerizable monomer and a binder resin, (d) a photopolymerization initiator, and (e) a polymer surfactant having a fluoro aliphatic group in a side chain. Patent Literature 2 discloses a method for producing a resin composition, including the steps of: (1) dissolving and/or dispersing (B) a colorant in (A) a dispersion of an inorganic filler dispersed in a solvent; and (2) then dissolving (C) a novolac-based epoxy resin therein. Patent Literature 3 discloses a technique of adding a synthetic resin colorant or the like containing an infrared absorber such as a naphthoquinone derivative, a pigment such as an azo-anthraquinone derivative, etc. to an epoxy resin.

Meanwhile, resin compositions supplemented with an alkenyl-substituted nadimide are used as curable resin compositions for use in prepregs or the like. The alkenyl-substituted nadimide is expected to have advantages such as solubility in many solvents routinely used, excellent compatibility with epoxy resins or the like, and obtainment of cured products (prepregs, etc.) excellent in physical properties such as high heat resistance.

CITATION LIST

Patent Literature

Patent Literature 1: Japanese Patent Laid-Open No. 2008-242273
Patent Literature 2: Japanese Patent Laid-Open No. 2009-114377
Patent Literature 3: Japanese Patent Laid-Open No. 2011-102384

SUMMARY OF INVENTION

Technical Problem

However, the present inventors have found that there still remain problems to be solved in association with use of a resin composition supplemented with the alkenyl-substituted nadimide described above and a colorant as a material for prepregs or the like. Specifically, the alkenyl-substituted nadimide has excellent solubility in solvents, resin components, etc. However, in the case of adding a colorant to a resin composition containing the alkenyl-substituted nadimide, a particular colorant is poorly soluble and is deposited in varnish. Therefore, when prepregs or the like are produced from such varnish containing the resin composition, filters for foreign matter removal are clogged, presenting an obstacle to the production of the prepregs or the like. Thus, the development of a resin composition colored into a predetermined color from a resin composition containing the alkenyl-substituted nadimide is still insufficient under these circumstances.

The present invention has been made in light of these circumstances, and an object of the present invention is to provide a resin composition containing an alkenyl-substituted nadimide, the resin composition being prevented from depositing a colorant and being excellent in manufacturability and colorability.

Solution to Problem

The present inventors have conducted diligent studies and consequently found that for a resin composition containing an alkenyl-substituted nadimide and a colorant, the object can be attained by controlling a perinone-based colorant as the colorant at a particular proportion or lower. On the basis of the finding, the present invention has been completed.

Specifically, the present invention is as described below.
<1>
A resin composition comprising an alkenyl-substituted nadimide and a perinone-based colorant, wherein
a content of the perinone-based colorant is 0.8 parts by mass or less based on 100 parts by mass in total of resin-constituting components in the resin composition.
<2>
The resin composition according to <1>, wherein the resin composition comprises, as the alkenyl-substituted nadimide, a compound represented by the following general formula (1):

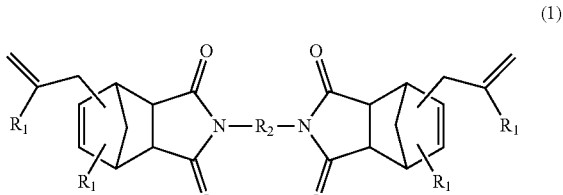

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

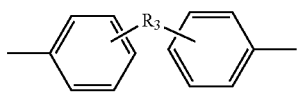
(2)

wherein $R_3$ represents a methylene group, an isopropylidene group, or a substituent represented by —CO—, —O—, —S— or >$SO_2$, and

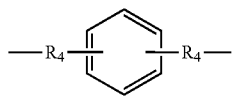
(3)

wherein each $R_4$ independently represents an alkylene group having 1 to 4 carbon atoms, or a group represented by >$SO_2$.

<3>
The resin composition according to <1> or <2>, wherein the resin composition comprises, as the alkenyl-substituted nadimide, a compound represented by the following formula (4) and/or (5):

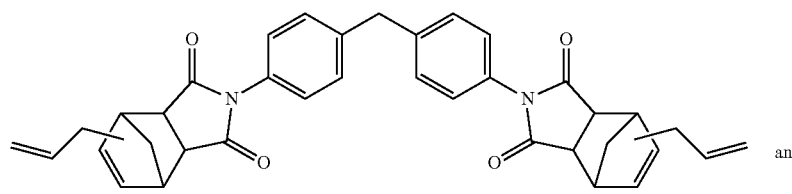
(4)

and

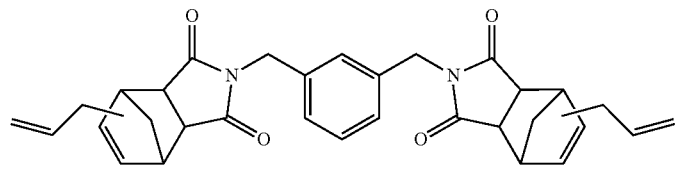
(5)

<4>
The resin composition according to any of <1> to <3>, further comprising a maleimide compound.
<5>
The resin composition according to <4>, wherein the resin composition comprises, as the maleimide compound, at least one selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following general formula (6):

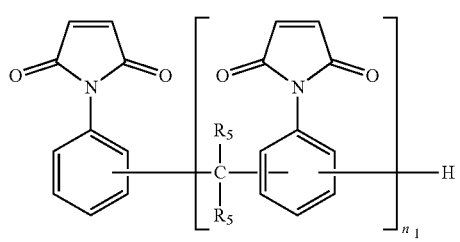
(6)

wherein each $R_5$ independently represents a hydrogen atom or a methyl group, and $n_1$ represents an integer of 1 or more.

<6>
The resin composition according to any of <1> to <5>, further comprising a cyanic acid ester compound.
<7>
The resin composition according to <6>, wherein the resin composition comprises, as the cyanic acid ester compound, a compound represented by the following general formula (7) and/or (8):

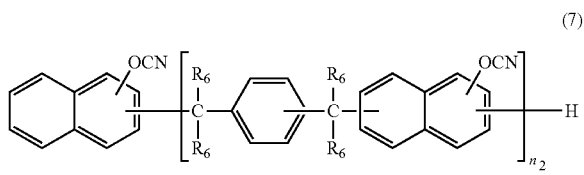
(7)

wherein each $R_6$ independently represents a hydrogen atom or a methyl group, and $n_2$ represents an integer of 1 or more, and

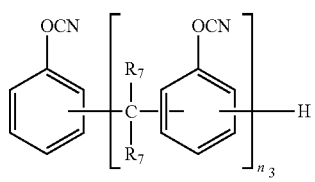
(8)

wherein each $R_7$ independently represents a hydrogen atom or a methyl group, and $n_3$ represents an integer of 1 or more.
<8>
The resin composition according to any of <1> to <7>, further comprising a filler.
<9>
The resin composition according to <8>, wherein a content of the filler is 25 parts by mass or more and 350 parts by mass or less based on 100 parts by mass in total of resin-constituting components in the resin composition.
<10>
A prepreg comprising a base material and the resin composition according to any of <1> to <9>, the base material being impregnated or coated with the resin composition.

<11>
The prepreg according to <10>, wherein the base material is at least one selected from the group consisting of E glass cloth, T glass cloth, S glass cloth, Q glass cloth, and an organic fiber.
<12>
A resin sheet comprising a support and the resin composition according to any of <1> to <9>, the support being coated with the resin composition.
<13>
A laminate comprising one or more layers of at least one selected from the group consisting of the prepreg according to <10> or <11> and the resin sheet according to <12>,
wherein the laminate comprises a cured product of the resin composition contained in the at least one selected from the group consisting of the prepreg and the resin sheet.
<14>
A metal foil-clad laminate having at least one selected from the group consisting of the prepreg according to <10> or <11> and the resin sheet according to <12>, and a metal foil disposed on one side or both sides of the at least one selected from the group consisting of the prepreg and the resin sheet,
wherein the metal foil-clad laminate comprises a cured product of the resin composition contained in the at least one selected from the group consisting of the prepreg and the resin sheet.
<15>
A printed circuit board comprising an insulating layer and a conductor layer formed on the surface of the insulating layer, wherein the insulating layer comprises the resin composition according to any of <1> to <9>.

Advantageous Effects of Invention

The present invention can provide a resin composition containing an alkenyl-substituted nadimide, the resin composition being prevented from depositing a colorant and being excellent in manufacturability and colorability.

DESCRIPTION OF EMBODIMENTS

Hereinafter, the mode for carrying out the present invention (hereinafter, also referred to as the "present embodiment") will be described in detail. The present embodiment below is given for illustrating the present invention and is not intended to limit the present invention to the contents described below. Various changes or modifications may be made in the present invention without departing from the spirit of the present invention.

The resin composition of the present embodiment is a resin composition comprising an alkenyl-substituted nadimide and a perinone-based colorant, wherein the content of the perinone-based colorant in this resin composition is 0.8 parts by mass or less based on 100 parts by mass in total of resin-constituting components (also including components that form resins by polymerization; the same holds true for the description below) in the resin composition. In this context, the "resin-constituting components" encompass not only resins themselves but components constituting these resins. In the present embodiment, examples of the resin-constituting components include an alkenyl-substituted nadimide, a maleimide compound, and a cyanic acid ester compound mentioned later. Further examples thereof include thermosetting resins and thermoplastic resins containing a constituent other than the components described above, such as epoxy resins, benzoxazine resins, phenol resins, and bismaleimide-triazine resins (BT resins), mentioned later. In a preferred embodiment, the "resin-constituting components" used herein are preferably "resin-constituting components except for coupling agents, dispersants, and surface conditioners" from the viewpoint of producing better effects.

The present inventors have found that for a resin composition comprising an alkenyl-substituted nadimide and a perinone-based colorant, the perinone-based colorant in the resin composition can be prevented from being insolubilized, by controlling the content of the perinone-based colorant to equal to or lower than the upper limit described above. As a result, the deposition of the perinone-based colorant in varnish can be prevented, and filter clogging can be prevented. Also, the resin composition can be colored into a desired color. The content of the perinone-based colorant based on 100 parts by mass in total of resin-constituting components in the resin composition is preferably 0.8 parts by mass or less, more preferably 0.6 parts by mass or less, from such a viewpoint. From the viewpoint described above, there may be no lower limit of the content of the perinone-based colorant. The lower limit of the content of the perinone-based colorant is preferably 0.1 parts by mass or more, more preferably 0.2 parts by mass or more, from the viewpoint of the balance between the suppression of coloring and cost efficiency, etc.

Examples of the perinone-based colorant include condensed-ring compounds that have a polycyclic structure and develop orange color. Alternatively, a commercially available product such as C.I. Solvent Green 5 or C.I. Solvent Orange 60 may be used as the perinone-based colorant. Such a commercially available colorant may contain the perinone-based colorant and other colorants. Examples thereof include "Kayaset Black A-N" from Nippon Kayaku Co., Ltd. Colorants of three primary colors may be used in combination at a particular ratio for developing the color. In the case of using such a colorant, the content of the perinone-based colorant in the resin composition can be set to the range described above to thereby prevent the insolubilization of the colorant and also reduce undesirable contamination by the colorant.

The alkenyl-substituted nadimide is not particularly limited as long as the alkenyl-substituted nadimide is an allyl compound having two or more nadimide groups in the molecule. The alkenyl-substituted nadimide is preferably a compound represented by the following general formula (1) from the viewpoint of solvent solubility and laminate characteristics:

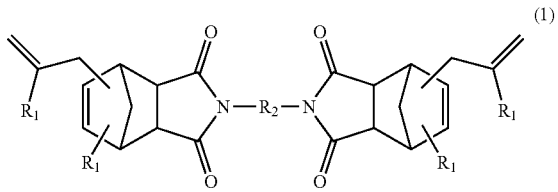

In the general formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

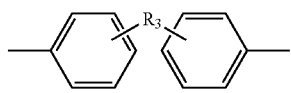
(2)

In the general formula (2), $R_3$ represents a methylene group, an isopropylidene group, or a substituent represented by —CO—, —O—, —S— or >SO$_2$.

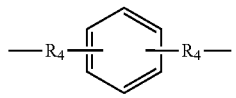
(3)

In the general formula (3), each $R_4$ independently represents an alkylene group having 1 to 4 carbon atoms, or a group represented by >SO$_2$.

Among those described above, a compound represented by the formula (4) and/or (5) given below is more preferred as the alkenyl-substituted nadimide. Commercially available products can also be used as these compounds. Examples of the compound represented by the formula (4) include "BANI-M" manufactured by Maruzen Petrochemical Co., Ltd. Examples of the compound represented by the formula (5) include "BANI-X" manufactured by Maruzen Petrochemical Co., Ltd. These compounds may be used singly or may be used in combinations of two or more thereof.

(4)

(5)

Preferably, the resin composition of the present embodiment further comprises a maleimide compound. The resin composition comprising the maleimide compound can be efficiently cured.

The maleimide compound is not particularly limited as long as the compound has one or more maleimide groups in the molecule. Preferred examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the formula (6) given below, prepolymers of these maleimide compounds, and prepolymers of the maleimide compounds and amine compounds. These compounds may be used singly or may be used in combinations of two or more thereof.

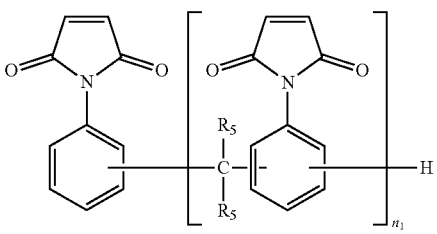
(6)

In the general formula (6), each $R_5$ independently represents a hydrogen atom or a methyl group, and $n_1$ represents an integer of 1 or more.

In the formula (6), $R_5$ is preferably a hydrogen atom. The upper limit of $n_1$ is preferably 10, more preferably 7.

Among those described above, at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the general formula (6) is more preferred as the maleimide compound from the viewpoint of solvent solubility, heat resistance, and desmear resistance.

In the resin composition of the present embodiment, the content of the alkenyl-substituted nadimide is preferably 15 to 60 parts by mass, more preferably 20 to 60 parts by mass, further preferably 25 to 50 parts by mass, based on 100 parts by mass in total of resin-constituting components in the resin composition. When the content of the alkenyl-substituted nadimide falls within the range described above, the resulting resin composition can maintain excellent moldability even with an inorganic filler, while curability, elastic modulus under heat, desmear resistance, etc. can be further improved.

The content of the maleimide compound can be suitably determined in consideration of the ratio of the number of functional group between the number of alkenyl groups ($\alpha$) as a functional group in the alkenyl-substituted nadimide and the number of maleimide groups ($\beta$) in the maleimide compound ([$\beta/\alpha$]). This ratio ([$\beta/\alpha$]) is preferably 0.9 to 4.3, more preferably 1.5 to 4.0. When this functional group ratio ([$\beta/\alpha$]) falls within the range described above, low thermal expansion, elastic modulus under heat, heat resistance, heat resistance upon moisture-absorbing, desmear resistance, easy curability, etc. can be further improved.

Preferably, the resin composition of the present embodiment further comprises a cyanic acid ester compound from the viewpoint of heat resistance, metal foil peel strength, and desmear resistance. Examples of the type of the cyanic acid ester compound include, but are not particularly limited to, a naphthol aralkyl-based cyanic acid ester represented by the general formula (7) given below, a novolac-based cyanic acid ester represented by the general formula (8) given below, biphenyl aralkyl-based cyanic acid esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2-bis(4-cyanatophenyl)propane.

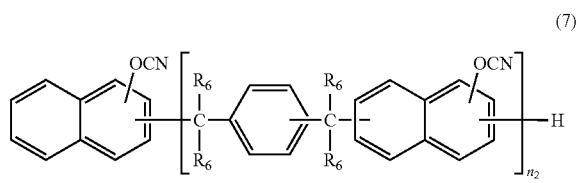

(7)

In the general formula (7), each $R_6$ independently represents a hydrogen atom or a methyl group, and $n_2$ represents an integer of 1 or more.

In the formula (7), $R_6$ is preferably a hydrogen atom. The upper limit of $n_2$ is preferably 10 or less, more preferably 6 or less.

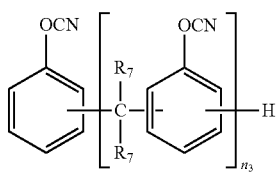

(8)

In the general formula (8), each $R_7$ independently represents a hydrogen atom or a methyl group, and $n_3$ represents an integer of 1 or more.

In the formula (8), $R_7$ is preferably a hydrogen atom. The upper limit of $n_3$ is preferably 10 or less, more preferably 7 or less.

Among those described above, a naphthol aralkyl-based cyanic acid ester represented by the general formula (7), a novolac-based cyanic acid ester represented by the general formula (8), or a biphenyl aralkyl-based cyanic acid ester is more preferred because of excellent flame retardancy, high curability, and the low coefficient of thermal expansion of a cured product. A naphthol aralkyl-based cyanic acid ester represented by the general formula (7) or a novolac-based cyanic acid ester represented by the general formula (8) is further preferred.

In the resin composition of the present embodiment, the content of the cyanic acid ester compound is preferably 0.1 to 20 parts by mass, more preferably 0.1 to 15 parts by mass, based on 100 parts by mass in total of resin-constituting components in the resin composition. When the content of the cyanic acid ester compound falls within the range described above, the resulting resin composition can maintain excellent moldability even with an inorganic filler, while curability, elastic modulus under heat, desmear resistance, etc. can be further improved.

Methods for producing these cyanic acid ester compounds are not particularly limited, and the cyanic acid ester compound used in the present embodiment may be produced by any method existing as a cyanic acid ester synthesis method. As a specific example, the cyanic acid ester compound can be obtained by reacting a naphthol aralkyl-based phenol resin represented by the general formula (9) given below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

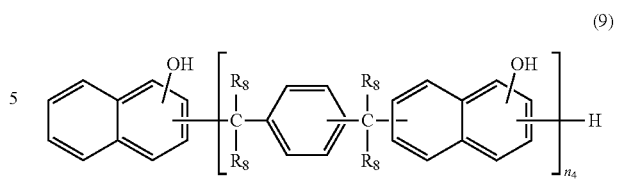

(9)

In the general formula (9), each $R_8$ independently represents a hydrogen atom or a methyl group and is particularly preferably a hydrogen atom.

In the formula (9), $n_4$ represents an integer of 1 or more. The upper limit of $n_4$ is preferably 10, more preferably 6.

The naphthol aralkyl-based cyanic acid ester compound can be selected from those obtained by condensing cyanic acid with a naphthol aralkyl resin obtained through the reaction of a naphthol such as α-naphthol or β-naphthol with p-xylylene glycol, α,α'-dimethoxy-p-xylene, 1,4-di(2-hydroxy-2-propyl)benzene, or the like.

Preferably, the resin composition of the present embodiment further comprises a filler. The resin composition may be supplemented with an additional resin, in addition to the components described above, without impairing the intended characteristics of the present embodiment. The type of the additional resin is not particularly limited as long as the resin does not impair insulating properties. Examples thereof include thermosetting resins and thermoplastic resins containing a constituent other than the components described above, such as epoxy resins, benzoxazine resins, phenol resins, and BT resins. Appropriately combined use with these resins can further improve metal adhesion, stress-relaxing properties, etc.

The filler is not particularly limited by its type, and a filler known in the art can be appropriately used. A filler generally used in laminates can be preferably used. Specific examples thereof include: inorganic fillers such as silicas (e.g., natural silica, fused silica, synthetic silica, amorphous silica, Aerosil, and hollow silica), white carbon, titanium white, zinc oxide, magnesium oxide, zirconium oxide, nitrides (e.g., boron nitride, agglomerated boron nitride, silicon nitride, and carbon nitride), carbides (e.g., silicon carbide), titanates (e.g., strontium titanate and barium titanate), aluminum nitride, sulfates or sulfites (e.g., barium sulfate, calcium sulfate, and calcium sulfite), metal hydroxides (e.g., aluminum hydroxide, heat-treated products of aluminum hydroxide (aluminum hydroxide from which a portion of water of crystallization has been reduced by heat treatment), magnesium hydroxide, and calcium hydroxide), molybdenum compounds (e.g., molybdenum oxide and zinc molybdate), carbonates (e.g., calcium carbonate, magnesium carbonate, and hydrotalcite), borates (e.g., zinc borate, barium metaborate, aluminum borate, calcium borate, and sodium borate), zinc stannate, alumina, gibbsite, boehmite, clay, kaolin, talc, fired clay, fired kaolin, fired talc, mica, E-glass, A-glass, NE-glass, C-glass, L-glass, D-glass, S-glass, M-glass G20, short glass fiber (including fine glass powders such as E glass, T glass, D glass, S glass, and Q glass), hollow glass, and spherical glass; and organic fillers such as styrene-based, butadiene-based, and acrylic rubber powders, core-shell rubber powders, silicone resin powders, silicone rubber powders, and silicone composite powders. These fillers may be used singly or may be used in combinations of two or more thereof. Among them, an inorganic filler is preferred. Silica is more preferred from the viewpoint of low thermal expansion, and alumina or aluminum nitride is more preferred from the viewpoint of high thermal conductivity.

In the resin composition of the present embodiment, the content of the filler is not particularly limited and is preferably 25 to 350 parts by mass based on 100 parts by mass in total of resin-constituting components in the resin composition from the viewpoint of characteristics such as low thermal expansion and high thermal conductivity. The content of the filler is more preferably 50 to 350 parts by mass, further preferably 100 to 300 parts by mass.

In the resin composition of the present embodiment, a silane coupling agent and/or various dispersants such as a wetting dispersant may also be used in order to improve the dispersibility of fine particles and the adhesion strength between the resin and the fine particles or glass cloth.

In the case of using an inorganic filler as the filler, the inorganic filler is preferably used in combination with a silane coupling agent and/or a wetting dispersant. The silane coupling agent is not particularly limited by its type, and a silane coupling agent generally used in the surface treatment of inorganic matter can be preferably used. Specific examples thereof include: aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane and β-(3,4-epoxycyclohexyl)ethyltrimethoxysilane; vinylsilane-based silane coupling agents such as γ-methacryloxypropyltrimethoxysilane and vinyl-tri(β-methoxyethoxy)silane; cationic silane-based silane coupling agents such as N-β-(N-vinylbenzylaminoethyl)-γ-aminopropyltrimethoxysilane hydrochloride; phenylsilane-based silane coupling agents; and styryl-based silane coupling agents such as p-styryltrimethoxysilane, p-styryltriethoxysilane, p-styrylmethyldimethoxysilane, p-styrylmethyldiethoxysilane, and N-(vinylbenzyl)-2-aminoethyl-3-aminopropyltrimethoxysilane hydrochloride. These silane coupling agents may be used singly or may be used in combinations of two or more thereof.

The wetting dispersant is not particularly limited as long as the wetting dispersant is used as a dispersion stabilizer for paint. Examples of the wetting dispersant include "DISPERBYK-110", "DISPERBYK-111", "DISPERBYK-118", "DISPERBYK-180", "DISPERBYK-161", "DISPERBYK-W996", "DISPERBYK-W9010", and "DISPERBYK-W903" manufactured by BYK Japan K.K. These wetting dispersants may be used singly or may be used in combinations of two or more thereof.

In the resin composition of the present embodiment, a curing accelerator may also be used as long as it does not impair intended characteristics. Specific examples of the curing accelerator include, but are not limited to: imidazole compounds; organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. These curing accelerators may be used singly or may be used in combinations of two or more thereof.

The resin composition of the present embodiment preferably comprises an imidazole compound as the curing accelerator. The imidazole compound is not particularly limited and is preferably an imidazole compound represented by the following formula (10) from the viewpoint of more effectively and reliably exerting the working effects of the present embodiment.

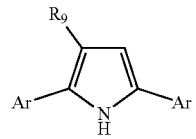

(10)

In this general formula (10), Ar represents a phenyl group, a naphthalene group, a biphenyl group, or an anthracene group, or a monovalent group thereof modified with a hydroxy group and is particularly preferably a phenyl group. $R_9$ represents a hydrogen atom, an alkyl group or a monovalent group thereof modified with a hydroxy group, or an aryl group. Examples of the aryl group include, but are not limited to, a substituted or unsubstituted phenyl group, naphthalene group, biphenyl group, and anthracene group. A phenyl group is preferred. More preferably, both of the Ar group and the $R_9$ group are phenyl groups.

Examples of the imidazole compound include, but are not limited to, 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,4,5-triphenylimidazole, and 2-phenyl-4-methylimidazole. Among them, 2,4,5-triphenylimidazole or 2-phenyl-4-methylimidazole is more preferred, and 2,4,5-triphenylimidazole is particularly preferred.

In the resin composition of the present embodiment, the content of the imidazole compound is not particularly limited and is preferably 0.01 to 10 parts by mass, more preferably 0.1 to 5 parts by mass, based on 100 parts by mass in total of resin-constituting components in the resin composition. When the content of the imidazole compound falls within such a range, a resin composition, a prepreg, and a resin sheet excellent in curability and moldability, and a metal foil-clad laminate and a printed circuit board from these raw materials can be obtained.

The resin composition of the present embodiment may contain a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents may be used singly or may be used in combinations of two or more thereof.

The resin composition of the present embodiment can be prepared according to a routine method. For example, a preferred method involves obtaining a resin composition homogeneously containing the alkenyl-substituted nadimide, the perinone-based colorant, and other optional components mentioned above. Specifically, for example, these components can be sequentially added to the solvent and fully stirred to readily prepare the resin composition of the present embodiment.

An organic solvent can be used, if necessary, in the preparation of the resin composition of the present embodiment. The type of the organic solvent is not particularly limited as long as the solvent is capable of dissolving the resins in the resin composition. Specific examples thereof are as listed above.

Treatment (stirring, mixing, or kneading treatment, etc.) known in the art for uniformly dissolving or dispersing each component can be carried out in the preparation of the resin composition. For example, the inorganic filler can be uniformly dispersed by stirring and dispersion treatment using a stirring vessel equipped with a stirrer having an appropriate stirring ability. This enhances the dispersibility of the inorganic filler in the resin composition. The stirring, mixing, or kneading treatment can be appropriately carried out using an apparatus known in the art such as an apparatus aimed at mixing, for example, a ball mill or a bead mill, or a revolution- or rotation-type mixing apparatus.

The resin composition of the present embodiment can be preferably used for various purposes as mentioned later by exploiting its feature that the resin composition is prevented from depositing a colorant and is excellent in manufacturability. Examples of such use of the resin composition include, but are not limited to, prepregs, resin sheets, laminates, metal foil-clad laminates, and printed circuit boards. Specifically, the resin composition of the present embodiment is particularly preferred as, for example, a resin composition for prepregs, a resin composition for resin sheets, a resin composition for laminates, a resin composition for metal foil-clad laminates, and a resin composition for printed circuit boards, in terms of its characteristics.

The prepreg of the present embodiment is a prepreg comprising a base material and the resin composition of the present embodiment, the base material being impregnated or coated with the resin composition. The prepreg of the present embodiment can be obtained, for example, by combining the resin composition with the base material, specifically, impregnating or coating the base material with the resin composition. The method for producing the prepreg of the present embodiment can be carried out according to a routine method without particular limitations. Examples thereof include a method which involves impregnating or coating the base material with the resin composition, followed by semi-curing (conversion to B-stage) by heating or the like for 1 to 30 minutes in a drier of 100 to 200° C. to prepare the prepreg. In the present embodiment, the amount of the resin composition based on the total mass of the prepreg is not particularly limited and is preferably in the range of 30 to 90% by mass. Particularly, when the resin composition comprises an inorganic filler, the amount of the resin composition based on the total amount of the prepreg more preferably falls within the range described above.

The base material for use in the prepreg of the present embodiment is not limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.); and organic fibers such as poly-p-phenylene benzoxazole (Zylon®, manufactured by Toyobo Co., Ltd.) and polyimide.

Among them, E glass cloth, T glass cloth, S glass cloth, Q glass cloth, or an organic fiber is preferred from the viewpoint of low thermal expansion.

These base materials may be used singly or may be used in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the base material of approximately 0.01 to 0.3 mm is preferably used. In particular, the base material is preferably a glass woven fabric having a thickness of 200 μm or less and a mass of 250 g/m$^2$ or less, more preferably a glass woven fabric made of, for example, E glass, S glass, or T glass fiber, from the viewpoint of strength and water absorbability.

The content of the resin composition is preferably 30 to 90% by mass, more preferably 35 to 85% by mass, further preferably 40 to 80% by mass, based on the total amount of the prepreg (including the amount of the filler). When the content of the resin composition falls within the range described above, moldability tends to be further improved. Particularly, in the case of using an inorganic filler and an organic filler in combination in the resin composition, moldability tends to be still further improved when the content of the resin composition falls within the range described above.

The laminate of the present embodiment comprises one or more layers of at least one selected from the group consisting of the prepreg mentioned above and a resin sheet mentioned later and comprises a cured product of the resin composition contained in the at least one selected from the group consisting of the aforementioned prepreg and the resin sheet. This laminate can be obtained by curing one or more layers of, for example, the prepreg. The metal foil-clad laminate of the present embodiment is a metal foil-clad laminate comprising at least one selected from the group consisting of the aforementioned prepreg and resin sheet, and a metal foil disposed on one side or both sides of the at least one selected from the group consisting of the aforementioned prepreg and resin sheet, wherein the metal foil-clad laminate comprises a cured product of the resin composition contained in the at least one selected from the group consisting of the aforementioned prepreg and resin sheet. This metal foil-clad laminate can be obtained by laminating, for example, the prepreg, with a metal foil, followed by curing. Specifically, the metal foil-clad laminate of the present embodiment can be obtained by providing at least one or more layers of, for example, the prepreg, and disposing the metal foil on one side or both sides thereof, followed by lamination molding. More specifically, the metal foil-clad laminate can be produced by providing one or more layers of the aforementioned prepreg, disposing the metal (e.g., copper or aluminum) foil on one side or both sides thereof if desired, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 μm, more preferably 1.5 to 35 μm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C. Alternatively, the prepreg may be lamination-molded in combination with a separately prepared wiring board for an inner layer to obtain a multilayer board.

The metal foil-clad laminate of the present embodiment can be preferably used as a printed circuit board by forming a predetermined wiring pattern. The metal foil-clad laminate of the present embodiment has a low coefficient of thermal expansion and favorable moldability, metal foil peel strength, and chemical resistance (particularly, desmear resistance) and can thus be used particularly effectively as a printed circuit board for semiconductor packages required to have such performance.

The resin sheet of the present embodiment comprises a support and the resin composition, the support being coated with the resin composition. Specifically, the resin composition is laminated on one side or both sides of the support. In this context, the resin sheet is used as an approach for thinning and can be produced, for example, by directly coating a support such as a metal foil or a film with a thermosetting resin for use in prepregs, etc., followed by drying.

The support for use in the production of the resin sheet of the present embodiment is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

The resin sheet of the present embodiment is particularly preferably a product obtained by coating the support with the aforementioned resin composition, followed by semi-curing (conversion to B-stage). The method for producing the resin sheet of the present embodiment is generally preferably a method for producing a composite of a B-stage resin and a support. Specific examples thereof include a method which involves coating the support such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 μm in terms of the resin thickness of the resin sheet.

The resin sheet of the present embodiment can be used as a buildup material for printed circuit boards.

The laminate of the present embodiment can be obtained by curing one or more layers of, for example, the resin sheet. The metal foil-clad laminate of the present embodiment can be obtained by laminating, for example, the resin sheet, with a metal foil, followed by curing. Specifically, the metal foil-clad laminate of the present embodiment can be obtained by using, for example, the resin sheet, and disposing the metal foil on one side or both sides thereof, followed by lamination molding. More specifically, the metal foil-clad laminate can be produced by providing, for example, one layer of the resin sheet mentioned above or two or more layers of the resin sheet separated from its support as desired, disposing the metal (e.g., copper or aluminum) foil on one side or both sides thereof, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C.

The laminate of the present embodiment may be a laminate obtained by curing one or more layers of a resin sheet and one or more layers of a prepreg or may be a metal foil-clad laminate obtained by curing a metal foil laminated with a resin sheet and a prepreg.

In the case of not adopting the form of the metal foil-clad laminate in the present embodiment, an electroless plating approach may be used for forming a conductor layer that serves as a circuit and preparing a printed circuit board.

The printed circuit board of the present embodiment is a printed circuit board comprising an insulating layer and a conductor layer formed on the surface of this insulating layer, wherein this insulating layer comprises the resin composition mentioned above.

The printed circuit board of the present embodiment is prepared, for example, by forming a conductor layer that serves as a circuit by use of a metal foil or electroless plating on the insulating layer. The conductor layer is generally constituted by copper or aluminum. The insulating layer for printed circuit boards with the conductor layer formed thereon can be preferably used as a printed circuit board by forming a predetermined wiring pattern. In addition, the printed circuit board of the present embodiment can be particularly effectively used as a printed circuit board for semiconductor packages, because by virtue of the insulating layer comprising the resin composition mentioned above, the printed circuit board maintains the excellent elastic modulus even at a reflow temperature during semiconductor packaging and thereby effectively suppresses the warpage of semiconductor plastic packages, and is excellent in metal foil peel strength and desmear resistance.

Specifically, the printed circuit board of the present embodiment can be produced by, for example, the following method: first, the metal foil-clad laminate (copper-clad laminate, etc.) is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

In the printed circuit board of the present embodiment, for example, the prepreg mentioned above (base material impregnated with the resin composition mentioned above), the resin sheet mentioned above, or the resin composition layer of the metal foil-clad laminate (layer composed of the resin composition mentioned above) constitutes the insulating layer comprising the resin composition mentioned above.

In the printed circuit board of the present embodiment, the insulating layer preferably has a difference of 20% or less, more preferably 0 to 20%, further preferably 0 to 15%, between the flexural modulus at 25° C. and the flexural modulus under heat at 250° C. When the difference between the flexural modulus at 25° C. and the flexural modulus under heat at 250° C. falls within the range described above, the insulating layer has a favorable rate of elastic modulus maintenance. In this context, the rate of elastic modulus maintenance refers to the ratio of the flexural modulus at 250° C. to the flexural modulus at 25° C.

In the present embodiment, examples of the approach for setting the difference between the flexural modulus at 25° C. and the flexural modulus under heat at 250° C. of the insulating layer to within 20% include, but are not particularly limited to, appropriately adjusting the type and content of each component in the resin composition for use in the insulating layer to the ranges described above.

EXAMPLES

Hereinafter, the present invention will be further specifically described with reference to Examples and Comparative Examples. However, the present invention is not intended to be limited by these Examples by any means.

Synthesis Example 1

A reactor equipped with a thermometer, a stirrer, a dropping funnel, and a reflux condenser was cooled to 0 to 5° C. in advance using brine and charged with 7.47 g (0.122 mol) of cyanogen chloride, 9.75 g (0.0935 mol) of 35% hydrochloric acid, 76 mL of water, and 44 mL of methylene chloride.

While the temperature and pH of this reactor were kept at −5 to +5° C. and 1 or lower, respectively, a solution containing 20 g (0.0935 mol) of an α-naphthol aralkyl-based phenol resin of the aforementioned formula (9) wherein all of the $R_8$ moieties were hydrogen atoms (SN485, OH group equivalent: 214 g/eq., softening point: 86° C., manufactured by Nippon Steel & Sumikin Chemical Co., Ltd.), and 14.16 g (0.14 mol) of triethylamine dissolved in 92 mL of methylene chloride was added dropwise over 1 hour through the dropping funnel with stirring. After the completion of the dropwise addition, 4.72 g (0.047 mol) of triethylamine was further added dropwise thereto over 15 minutes.

After the completion of the dropwise addition, the mixture was stirred at the same temperature as above for 15 minutes. The obtained organic layer was washed with 100 mL of water twice. Then, methylene chloride was distilled off under reduced pressure with an evaporator, and the residue was finally concentrated to dryness at 80° C. for 1 hour to obtain 23.5 g of a cyanic acid esterified product of the α-naphthol aralkyl-based phenol resin (α-naphthol aralkyl-based cyanic acid ester resin of the general formula (7) wherein all of the $R_6$ moieties were hydrogen atoms).

Example 1

10 parts by mass of the α-naphthol aralkyl-based cyanic acid ester resin (naphthol aralkyl-based cyanate) obtained in Synthesis Example 1, 45 parts by mass of a novolac-based bismaleimide compound (manufactured by Daiwakasei Industry Co., Ltd., "BMI-2300", novolac-based bismaleimide), 45 parts by mass of bisallylnadimide (manufactured by Maruzen Petrochemical Co., Ltd., "BANI-M"), 120 parts by mass of silica (particle size: 1.1 μm, manufactured by Admatechs Co., Ltd., "SC-4500SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 0.8 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

Example 2

10 parts by mass of the α-naphthol aralkyl-based cyanic acid ester resin (naphthol aralkyl-based cyanate) obtained in Synthesis Example 1, 45 parts by mass of a novolac-based bismaleimide compound (manufactured by Daiwakasei Industry Co., Ltd., "BMI-2300", novolac-based bismaleimide), 45 parts by mass of bisallylnadimide (manufactured by Maruzen Petrochemical Co., Ltd., "BANI-M"), 120 parts by mass of silica (particle size: 1.1 μm, manufactured by Admatechs Co., Ltd., "SC-4500SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 0.4 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

Example 3

10 parts by mass of the α-naphthol aralkyl-based cyanic acid ester resin (naphthol aralkyl-based cyanate) obtained in Synthesis Example 1, 45 parts by mass of a novolac-based bismaleimide compound (manufactured by Daiwakasei Industry Co., Ltd., "BMI-2300", novolac-based bismaleimide), 45 parts by mass of bisallylnadimide (manufactured by Maruzen Petrochemical Co., Ltd., "BANI-M"), 120 parts by mass of silica (particle size: 1.1 μm, manufactured by Admatechs Co., Ltd., "SC-4500SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 0.2 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

Example 4

10 parts by mass of the α-naphthol aralkyl-based cyanic acid ester resin (naphthol aralkyl-based cyanate) obtained in Synthesis Example 1, 45 parts by mass of a novolac-based bismaleimide compound (manufactured by Daiwakasei Industry Co., Ltd., "BMI-2300", novolac-based bismaleimide), 45 parts by mass of bisallylnadimide (manufactured by Maruzen Petrochemical Co., Ltd., "BANI-M"), 120 parts by mass of silica (particle size: 1.1 μm, manufactured by Admatechs Co., Ltd., "SC-4500SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 0.08 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

Comparative Example 1

10 parts by mass of the α-naphthol aralkyl-based cyanic acid ester resin (naphthol aralkyl-based cyanate) obtained in Synthesis Example 1, 45 parts by mass of a novolac-based bismaleimide compound (manufactured by Daiwakasei Industry Co., Ltd., "BMI-2300", novolac-based bismaleimide), 45 parts by mass of bisallylnadimide (manufactured by Maruzen Petrochemical Co., Ltd., "BANI-M"), 120 parts by mass of silica (particle size: 1.1 μm, manufactured by Admatechs Co., Ltd., "SC-4053SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 1.2 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

Comparative Example 2

20 parts by mass of the α-naphthol aralkyl-based cyanic acid ester resin (naphthol aralkyl-based cyanate) obtained in Synthesis Example 1, 27 parts by mass of a novolac-based bismaleimide compound (manufactured by Daiwakasei Industry Co., Ltd., "BMI-2300", novolac-based bismaleimide), 27 parts by mass of bisallylnadimide (manufactured by Maruzen Petrochemical Co., Ltd., "BANI-M"), 26 parts by mass of a biphenyl aralkyl-based epoxy resin (manufactured by Nippon Kayaku Co., Ltd., "NC-3000H", biphenyl aralkyl-based epoxy), 120 parts by mass of silica (particle size: 1.1 μm, manufactured by Admatechs Co., Ltd., "SC-4500SQ"), 5 parts by mass of a silane coupling agent (manufactured by Shin-Etsu Chemical Co., Ltd., "KBM-403", 3-glycidoxypropyltrimethoxysilane), 0.8 parts by mass of a wetting dispersant (manufactured by BYK Japan K.K., "DISPERBYK-161", amine-based wetting dispersant), 0.3 parts by mass of triphenylimidazole (manufactured by Tokyo Chemical Industry Co., Ltd., curing accelerator), and 1.2 parts by mass of a perinone-based colorant (C.I Solvent Orange 60) were mixed and diluted with methyl ethyl ketone to obtain varnish. An E glass woven fabric was impregnated and coated with this varnish, and dried by heating at 160° C. for 3 minutes to obtain a prepreg having a resin composition content of 44.5% by mass.

(Evaluation of Filter Clogging)

50 kg of the varnish prepared in each of Examples and Comparative Examples was circulated at a discharge flow rate of 0.6 m$^3$/h using a diaphragm pump to pass through a filter (filter with particle size cutoff of 40 μm). The varnish was circulated through the filter for 30 minutes from the start of varnish circulation to confirm whether the operation of the diaphragm pump would be stopped due to the clogging of the filter.

(Evaluation of Orange Residue after 53-μm Sieve Test)

400 g of the varnish prepared in each of Examples and Comparative Examples was washed off with methyl ethyl ketone (MEK) on a plain weave sieve having a nominal dimension (one side length of one mesh opening) of 53 μm, a frame size of 200×60 (D), and 280 mesh. Then, the presence or absence of a residue remaining on the sieve was visually evaluated.

(Evaluation of Color of Prepreg)

The color of the prepreg obtained in each of Examples and Comparative Examples was visually evaluated. The color was evaluated according to the following criteria.

⊙: Colored into the desired color (color derived from the perinone-based colorant).

○: Sufficiently colored into a color close to the desired one.

X: Insufficiently colored with a faint color.

TABLE 1

|  |  | Example 1 | Example 2 | Example 3 | Example 4 | Comparative Example 1 | Comparative Example 2 |
|---|---|---|---|---|---|---|---|
| Evaluation | Filter clogging | Not observed | Not observed | Not observed | Not observed | Observed | Observed |
|  | Orange residue after 53-μm sieve test | Absent | Absent | Absent | Absent | Present | Present |
|  | Prepreg color | ⊚ | ⊚ | ⊚ | ○ | X | X |

(resin components: novolac-based bismaleimide, bisallyl-nadimide, naphthol aralkyl-based cyanate, and biphenyl aralkyl-based epoxy)

From these tests, it was confirmed at least that filter clogging and an orange residue after the 53-μm sieve test were not observed in each Example. It was further confirmed that a prepreg having a uniform color was obtained in each Example.

INDUSTRIAL APPLICABILITY

The resin composition, the prepreg, the resin sheet, the laminate, and the printed circuit board according to the present invention can be preferably used as members for various electronics including personal computers, and communication devices.

The invention claimed is:

1. A resin composition comprising an alkenyl-substituted nadimide and a perinone-based colorant, wherein a content of the perinone-based colorant is 0.8 parts by mass or less based on 100 parts by mass in total of resin-constituting components in the resin composition, the resin composition further comprising a maleimide compound.

2. The resin composition according to claim 1, wherein the resin composition comprises, as the alkenyl-substituted nadimide, a compound represented by the following general formula (1):

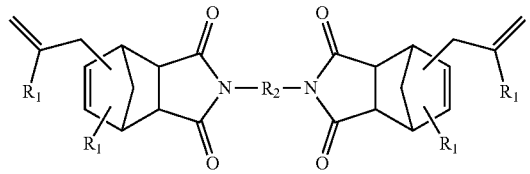

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

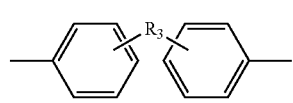

(2)

wherein $R_3$ represents a methylene group, an isopropylidene group, or a substituent represented by —CO—, —O—, —S— or >SO$_2$, and

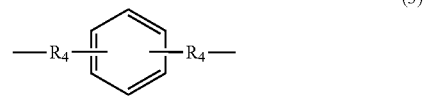

(3)

wherein each $R_4$ independently represents an alkylene group having 1 to 4 carbon atoms, or a group represented by >SO$_2$.

3. The resin composition according to claim 1, wherein the resin composition comprises, as the alkenyl-substituted nadimide, a compound represented by the following formula (4) and/or (5):

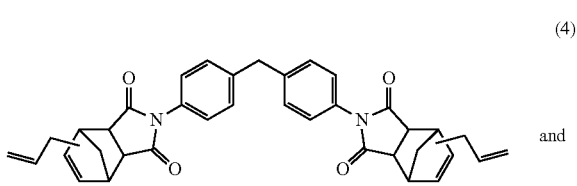

(4)

and

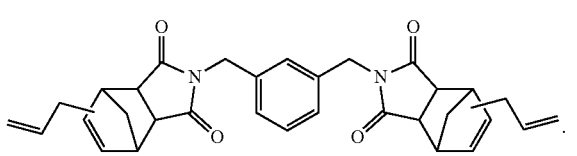

(5)

4. The resin composition according to claim 1, wherein the resin composition comprises, as the maleimide compound, at least one selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following general formula (6):

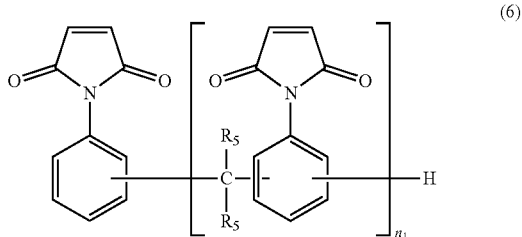

(6)

wherein each $R_5$ independently represents a hydrogen atom or a methyl group, and $n_1$ represents an integer of 1 or more.

5. The resin composition according to claim 1, further comprising a cyanic acid ester compound.

6. The resin composition according to claim 5, wherein the resin composition comprises, as the cyanic acid ester compound, a compound represented by the following general formula (7) and/or (8):

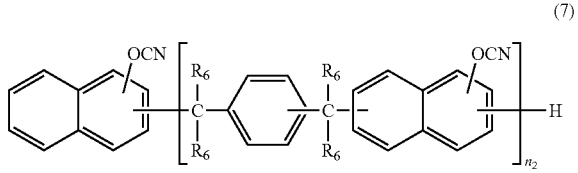
(7)

wherein each $R_6$ independently represents a hydrogen atom or a methyl group, and $n_2$ represents an integer of 1 or more, and

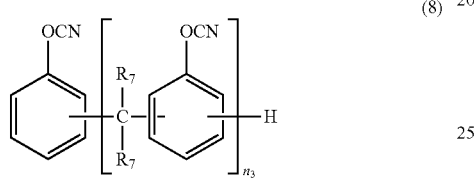
(8)

wherein each $R_7$ independently represents a hydrogen atom or a methyl group, and $n_3$ represents an integer of 1 or more.

7. The resin composition according to claim 1, further comprising a filler.

8. The resin composition according to claim 7, wherein a content of the filler is 25 parts by mass or more and 350 parts by mass or less based on 100 parts by mass in total of resin-constituting components in the resin composition.

9. A prepreg comprising a base material and the resin composition according to claim 1, the base material being impregnated or coated with the resin composition.

10. A resin sheet comprising a support and the resin composition according to claim 1, the support being coated with the resin composition.

11. A laminate comprising one or more layers of the prepreg according to claim 9, wherein the laminate comprises a cured product of the resin composition contained in the prepreg.

12. A metal foil-clad laminate comprising the prepreg according to claim 9, and a metal foil disposed on one side or both sides of the prepreg, wherein the metal foil-clad laminate comprises a cured product of the resin composition contained in the prepreg.

13. A printed circuit board comprising an insulating layer and a conductor layer formed on the surface of the insulating layer, wherein the insulating layer comprises the resin composition according to claim 1.

14. A laminate comprising one or more layers of a prepreg,
the prepreg comprising a base material and a resin composition comprising an alkenyl-substituted nadimide and a perinone-based colorant, wherein a content of the perinone-based colorant is 0.8 parts by mass or less based on 100 parts by mass in total of resin-constituting components in the resin composition,
the base material being impregnated or coated with the resin composition,
wherein the laminate comprises a cured product of the resin composition contained in the prepreg.

15. A metal foil-clad laminate comprising a prepreg comprising a base material and a resin composition comprising an alkenyl-substituted nadimide and a perinone-based colorant, wherein a content of the perinone-based colorant is 0.8 parts by mass or less based on 100 parts by mass in total of resin-constituting components in the resin composition,
wherein a metal foil is disposed on one side or both sides of the prepreg, and
wherein the metal foil-clad laminate comprises a cured product of the resin composition contained in the prepreg.

* * * * *